(12) United States Patent
Zhong et al.

(10) Patent No.: US 11,387,295 B2
(45) Date of Patent: Jul. 12, 2022

(54) TERMINAL DEVICE AND DISPLAY METHOD

(71) Applicant: Huawei Technologies Co., Ltd., Shenzhen (CN)

(72) Inventors: Ding Zhong, Dongguan (CN); Wei He, Shenzhen (CN); Wenwen Wu, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 60 days.

(21) Appl. No.: 16/931,773

(22) Filed: Jul. 17, 2020

(65) Prior Publication Data

US 2020/0350377 A1 Nov. 5, 2020

Related U.S. Application Data

(63) Continuation of application No. PCT/CN2019/072050, filed on Jan. 16, 2019.

(30) Foreign Application Priority Data

Jan. 19, 2018 (CN) .......................... 201810052745.0

(51) Int. Cl.
*H01L 27/32* (2006.01)
*H01L 51/52* (2006.01)
*H04M 1/02* (2006.01)

(52) U.S. Cl.
CPC ...... *H01L 27/3234* (2013.01); *H01L 27/3227* (2013.01); *H01L 27/3286* (2013.01); *H01L 51/5284* (2013.01); *H04M 1/0264* (2013.01); *H01L 2251/306* (2013.01); *H01L 2251/308* (2013.01)

(58) Field of Classification Search
CPC ............. H01L 27/3286; H01L 51/5284; H01L 27/3267; H01L 27/3281; H01L 27/326; H01L 27/3288
See application file for complete search history.

(56) References Cited

U.S. PATENT DOCUMENTS

2012/0257361 A1* 10/2012 Nishi .................. G02F 1/13452
361/748
2015/0355729 A1 12/2015 Park et al.
2016/0343787 A1 11/2016 Wu
(Continued)

FOREIGN PATENT DOCUMENTS

CN 203118951 U * 8/2013
CN 203118951 U 8/2013
(Continued)

OTHER PUBLICATIONS

"World's Thinnest PMOLED Touch Screen Surprise," Screen Printing Industry, Oct. 2015, 2 pages.

*Primary Examiner* — Alia Sabur
(74) *Attorney, Agent, or Firm* — Conley Rose, P.C.

(57) ABSTRACT

A terminal device includes a display screen module, wherein the display screen module comprises a passive matrix organic light-emitting diode (PMOLED) display panel, and an electrode cable of the PMOLED display panel comprises a transparent cable and a camera, wherein an orthographic projection of a lighting region of the camera on a display surface of a PMOLED display panel is located in the display region in which the transparent cable is located.

19 Claims, 10 Drawing Sheets

(56) References Cited

U.S. PATENT DOCUMENTS

| | | | |
|---|---|---|---|
| 2016/0349565 A1 | 12/2016 | Kim et al. | |
| 2017/0084572 A1* | 3/2017 | Liu | H01L 51/56 |
| 2017/0294488 A1 | 10/2017 | Lin et al. | |
| 2018/0114481 A1 | 4/2018 | Fu et al. | |
| 2019/0096319 A1 | 3/2019 | Wu et al. | |
| 2019/0130822 A1* | 5/2019 | Jung | G09G 3/3208 |
| 2020/0034100 A1* | 1/2020 | Fan | H01L 27/3288 |

FOREIGN PATENT DOCUMENTS

| | | | |
|---|---|---|---|
| CN | 104536179 A | | 4/2015 |
| CN | 104795434 A | | 7/2015 |
| CN | 105957449 A | | 9/2016 |
| CN | 106501998 A | | 3/2017 |
| CN | 106713546 A | | 5/2017 |
| CN | 106935613 A | | 7/2017 |
| CN | 107170384 A | | 9/2017 |
| CN | 107241466 A | * | 10/2017 |
| CN | 107272242 A | | 10/2017 |
| CN | 107425040 A | | 12/2017 |
| CN | 206741360 U | | 12/2017 |
| CN | 107579107 A | | 1/2018 |
| CN | 207781599 U | | 8/2018 |
| GB | 2552090 A | | 1/2018 |
| KR | 20150074241 A | | 7/2015 |

\* cited by examiner

TERMINAL DEVICE AND DISPLAY METHOD

CROSS-REFERENCE TO RELATED APPLICATIONS

This application is a continuation of International Patent Application No. PCT/CN2019/072050, filed on Jan. 16, 2019, which claims priority to Chinese Patent Application No. 201810052745.0, filed on Jan. 19, 2018, both of which are hereby incorporated by reference in their entireties.

TECHNICAL FIELD

This application relates to the field of display technologies, and more specifically, to a terminal device and a display method.

BACKGROUND

A bezel-less screen terminal device is usually a terminal device with a screen-to-body ratio (a ratio of an area of the screen to an area of the front panel) up to 80%. To achieve a bezel-less screen and ensure normal operation of a front-facing camera, an existing terminal device generally uses a relatively large display panel to achieve a bezel-less screen, and a small physical via hole is disposed between pixels of the display panel above the camera to meet a lighting requirement of the front-facing camera. However, light that can be transmitted through these small physical via holes is relatively limited, and it is difficult to meet a requirement of the front-facing camera on light intensity.

SUMMARY

This application provides a terminal device and a display method to meet a lighting requirement of a camera during operation.

According to a first aspect, a terminal device is provided, where the terminal device includes a display screen module and a front-facing camera, where the display screen module includes a passive matrix organic light-emitting diode (PMOLED) display panel, and electrode cables of the PMOLED display panel include a transparent cable, and an area in which an orthographic projection of a lighting region of the camera on a display surface of the PMOLED display panel is located is located in a display area in which the transparent cable is located.

The foregoing display screen module may further include a cover, a display panel, a touch layer, a flat cable, and the like.

In a possible implementation, the display screen module is disposed on an external side of the camera, and the camera is disposed on an internal side of the display screen module.

In a possible implementation, the terminal device further includes a rear housing, and the camera is disposed between the display screen module and the rear housing.

It should be understood that, when the display surface of the display screen module is placed upward, the display area in which the transparent cable of the foregoing PMOLED display panel is located is right above the camera.

The PMOLED display panel may refer to a display panel including a PMOLED, and the PMOLED display panel usually has better light transmission performance.

The camera may be located at the top or bottom of the terminal device. The foregoing camera may be used for selfie, video calling, video chat, as a mirror, or the like.

The camera may be a front-facing camera of the terminal device or a rear-facing camera of the terminal device.

For example, when the terminal device only has a display screen on the front side, the foregoing camera may be a front-facing camera. Alternatively, when the terminal device has a display screen on the rear side, the camera may be a rear-facing camera.

In addition, the foregoing display surface of the display screen module may be located on a front surface or a rear surface of the terminal device.

Optionally, the foregoing transparent cable may refer to a cable with a light transmittance greater than or equal to 80%.

In a possible implementation, the transparent cable includes any one of indium tin oxide (ITO), indium zinc oxide (IZO), indium gallium zinc oxide (IGZO), indium gallium Sn oxide (InGaSnO), and graphene.

It should be understood that, assuming that an area in which an orthographic projection of a lighting area of the camera on a display surface of the PMOLED display panel is located is a first area, and a display area in which the transparent cable in the PMOLED display panel is located is a second area, the first area and the second area may completely overlap, and the first region may also be inside the second region (in this case, the area of the first region is smaller than the area of the second region).

In this application, because the transparent cable on the PMOLED display panel has a better light transmission effect in the display region, the camera is disposed below the region in which the transparent cable on the PMOLED display panel is located such that relatively more light can be transmitted when the camera works to meet a lighting requirement of a camera during operation Further, in this application, disposing the display panel above the camera does not affect normal lighting of the camera. Therefore, the bezel-less screen may be achieved by disposing a display panel with a relatively large area. Therefore, in this application, the bezel-less screen of the terminal device can be achieved on the premise of ensuring that the camera works normally.

In a possible implementation, the electrode cable of the PMOLED display panel further includes a non-transparent cable, the non-transparent cable and the transparent cable are located in different regions of the PMOLED display panel, and there is no intersection set (or an intersection set is an empty set) between the transparent cable and the region in which the non-transparent cable is located.

In a possible implementation, via holes are disposed on the PMOLED display panel, and electrode cables of the PMOLED display panel are converged to the control circuit board of the display screen module through the via holes.

In this application, the electrode cables on the PMOLED display panel can penetrate through the via holes to the bottom of the PMOLED, and then converge to the control circuit board, it may prevent long side bending when the electrode cable is directly drawn to the control circuit board, and a black edge phenomenon at the edge of the PMOLED display panel due to the long side bending can be avoided.

Optionally, the via hole is a metal via hole.

The control circuit board may be located on a soft cable connected between the display screen and the board of the terminal device.

The processor of the terminal device may implement control of screen on and screen off (turn off) on the PMOLED display panel using the foregoing control circuit board.

In a possible implementation, the via holes are located in an edge area (an edge portion) of the PMOLED display panel.

In a possible implementation, the via holes are located in an area in the PMOLED display panel, where a distance between the area and a center of the PMOLED display panel or a fixed position exceeds a preset distance.

It should be understood that the edge area of the display panel or an area in which the edge portion of the display panel is located may be an area in the PMOLED display panel, where a distance between the area and a center of the PMOLED display panel or a fixed position exceeds a preset distance.

In a possible implementation, the display screen module further includes an active-matrix organic light-emitting diode (AMOLED) or AMOLED display panel, and the display screen module includes an AMOLED display panel and a PMOLED display panel.

It should be understood that the AMOLED display panel may be a display panel including AMOLEDs. Light transmission performance of the AMOLED display panel is usually poorer than light transmission performance of the PMOLED display panel.

In a possible implementation, the display screen module is combined by splicing a PMOLED display panel and an AMOLED display panel in parallel, and the PMOLED display panel and the AMOLED display panel share a same substrate and organic light emitting layers.

The PMOLED display panel and the AMOLED display panel can be seamlessly spliced by sharing the same substrate and the same organic light emitting layer, to improve an overall display effect when the display screen module displays an image.

In a possible implementation, the AMOLED display panel is disposed around the PMOLED display panel.

Specifically, the PMOLED display panel is located in an area above the camera, the PMOLED display panel is surrounded by the AMOLED display panel, and three bezels of the AMOLED display panel are adjacent to the AMOLED display panel.

In a possible implementation, the display screen module is formed by superposing and splicing a PMOLED display panel and an AMOLED display panel. The PMOLED display panel is located on an external side of the AMOLED display panel, the AMOLED display panel is provided with a window, and the PMOLED display panel is superimposed on an edge of the window of the AMOLED display panel, and covers the window of the AMOLED display panel.

The AMOLED display panel is disposed on the internal side of the PMOLED display panel such that the display area of the PMOLED display panel can be used to block the bezel at the window of the AMOLED display panel, thereby avoiding a black edge generated when an image is displayed at a boundary between the PMOLED display panel and the AMOLED display panel.

In a possible implementation, pixel density of the PMOLED display panel is the same as pixel density of the AMOLED display panel.

The PMOLED display panel and the AMOLED display panel that have same pixel density are spliced to obtain the display screen module such that uniformity in image display may be improved, and a display effect may be improved.

In a possible implementation, the terminal device further includes a light shielding film, where the light shielding film is disposed on the rear side of the PMOLED display panel, and an orthographic projection of the light shielding film on the display surface of the PMOLED display panel is outside an area in which the transparent cable is located.

It should be understood that, the rear side of the PMOLED display panel refers to a surface that is of the PMOLED display panel and that faces an interior of the terminal device (or a rear housing of the terminal device).

The light shielding film is located below another display area except the display area in which the transparent cable on the PMOLED display panel is located.

A light shielding film can be used to block a component inside the terminal device, and an aesthetic effect can be achieved.

In a possible implementation, the foregoing terminal device further includes a light sensor, where an orthographic projection of the light sensor on a display surface of a PMOLED display panel is located in a display area in which a transparent cable is located.

Optionally, the light sensor is a light sensor configured to sense ambient light intensity in the terminal device.

It should be understood that the foregoing light sensor and the camera belong to different components. The light sensor may be generally distributed at the top of the terminal device, and specifically, the light sensor may be distributed in an area adjacent to the camera.

In this application, because the transparent cable on the PMOLED display panel has a better light transmission effect in the display area, the light sensor is disposed below the area in which the transparent cable on the PMOLED display panel is located such that when the light sensor works a requirement for sensing external light can be met.

According to a second aspect, a terminal device is provided, where the terminal device includes a display screen module, a camera, a control circuit, and a processor. The display screen module includes a PMOLED display panel, and an electrode cable of the PMOLED display panel includes a transparent cable, an area in which an orthographic projection of a lighting region of the camera on the display surface of the PMOLED display panel is located is in the display area in which the transparent cable is located. The control circuit is connected to the PMOLED display panel, and is configured to control screen-on and a screen-off of the PMOLED display panel.

The foregoing processor is further configured to, when the camera is in a working state, sending a first control signal to a control circuit, to control a PMOLED display panel to enter a screen-off state, when the camera is in a non-working state, sending a second control signal to the control circuit, to control the PMOLED display panel to enter a screen-on state.

After receiving the first control signal, the foregoing control circuit controls the PMOLED display panel such that the PMOLED display panel enters the screen-off state, after receiving the second control signal, the foregoing control circuit controls the PMOLED display panel such that the PMOLED display panel enters a screen-on state.

In this application, because the camera is disposed below the region (the region has relatively high light transmission performance) where the transparent cable on the PMOLED display panel is located, the processor sends the corresponding control instruction, to control a screen-on and a screen-off of the PMOLED display panel, thereby meeting the lighting requirement when the camera works.

Optionally, the foregoing first control signal and the second control signal may alternatively be generated by a controller in the terminal device and sent to the control circuit.

According to a third aspect, a display method is provided. The method is applied to the terminal device in the first aspect or the second aspect, and the method further includes, when the camera is in a working state, controlling a PMOLED display panel such that the PMOLED display panel enters a screen-off state, controlling a PMOLED display panel when the camera is in a non-working state such that the PMOLED display panel enters a screen-on state.

In this application, because the camera is disposed below the region (the region in which the transparent cable is located) that has better light transmission performance and that is on the PMOLED display panel, in this way, screen-on and screen-off of the PMOLED display panel is controlled to meet the lighting requirement when the camera works.

It should be understood that, in the first aspect, explanations and limitations of modules of the terminal device are also applicable to the terminal device in the second aspect of this application and the terminal device to which the method in the third aspect is applied.

DESCRIPTION OF EMBODIMENTS

The following describes technical solutions of this application with reference to the accompanying drawings.

The terminal device in this embodiment of this application may be a smartphone, a personal digital assistant (PDA), another intelligent device having a touchscreen, or the like. Further, the terminal device in this embodiment of this application may be a terminal device that has a bezel-less screen (a ratio of an area of the screen to an area of a front panel reaches more than 80%).

Figure 1:
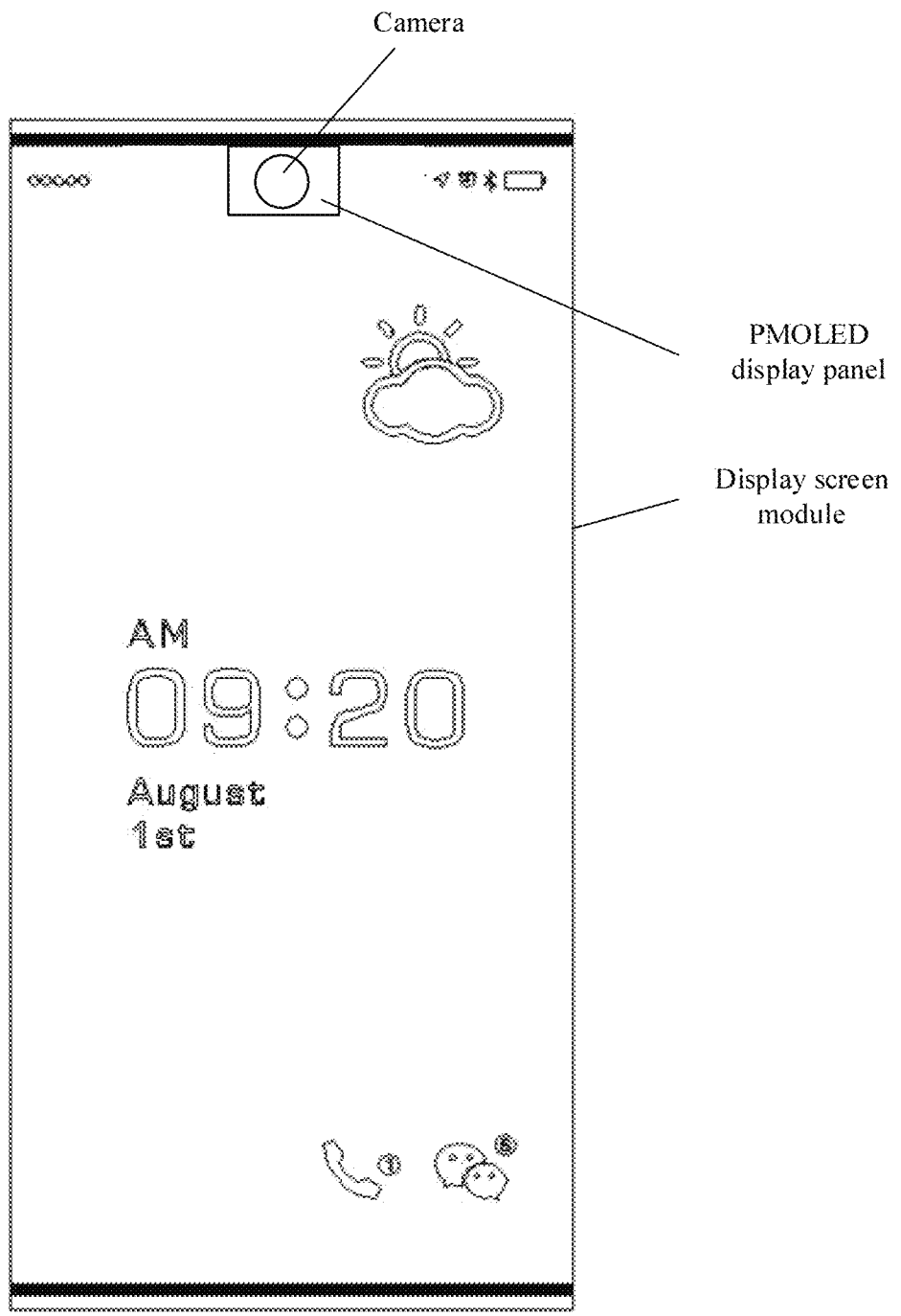
FIG. 1 is a schematic diagram of a terminal device according to an embodiment of this application.

FIG. 1 is a schematic diagram of a terminal device according to an embodiment of this application.

FIG. 1 is a front view of a terminal device according to an embodiment of this application. As shown in FIG. 1, the terminal device includes a display screen module and a camera.

The display screen module includes a PMOLED display panel, and electrode cables of the PMOLED display panel include a transparent cable. An orthographic projection of a lighting region or a lighting surface of the camera on a display surface of the PMOLED display panel is located in a display region in which the transparent cable is located.

It should be understood that, the foregoing display screen module may be located on an external side of the camera, and the camera is located on an internal side of the display screen module, that is, the camera is located between the display screen module and a rear housing of the terminal device.

It should be further understood that, in addition to the PMOLED display panel, the display screen module may further include a first display panel. The first display panel may be a display panel including any one of a liquid-crystal display (LCD), a micro light-emitting diode (micro LED), or an AMOLED.

Optionally, the transparent cable is a cable with a light transmittance greater than or equal to 80%.

Optionally, the foregoing transparent cable may be made of a material with a relatively good light transmittance.

Specifically, a material of the transparent cable is ITO, IZO, IGZO, InGaSnO, graphene, or the like.

It should be understood that materials of the transparent cable in this application are not limited to the foregoing several materials, and another material that has relatively good light transmission performance and that is suitable to be used as an electrode cable also falls within the protection scope of this application.

The PMOLED display panel may further include a non-transparent cable in addition to the transparent cable. The non-transparent cable may be specifically a metal cable.

Optionally, in the PMOLED display panel, the transparent cable may be located only in a region that is in the PMOLED display panel and that is right above the camera, and a non-transparent cable may be disposed in another region on the PMOLED display panel.

The transparent cable is arranged only in the region that is on the PMOLED display panel and that is right above the camera, and the non-transparent cable is arranged in another region such that light transmission performance of the region in which the transparent cable is located can be improved, and it is ensured that an impedance of an electrode cable of the PMOLED is not excessively high.

In this application, the camera is disposed below the region that is on the PMOLED display panel and in which the transparent cable with better light transmission effect is located such that a lighting requirement of the camera during normal operation can be met.

Specifically, when the camera is in a working state, the PMOLED display panel is in a screen-off state, to ensure that the camera can normally collect light. When the camera is in a non-working state, the PMOLED display panel is in a screen-on state. Therefore, the terminal device in the embodiment of this application can ensure normal operation of the camera while implementing bezel-less screen display.

It should be understood that an area of an orthographic projection generated on a display surface of the PMOLED display panel by the lighting region of the camera or the lighting surface of the camera may be less than or equal to an area of a region in which the transparent cable is located, and the orthographic projection generated on the display surface of the PMOLED display panel by the lighting region or the lighting surface of the camera may be included in the region in which the transparent cable is located.

Figure 2:
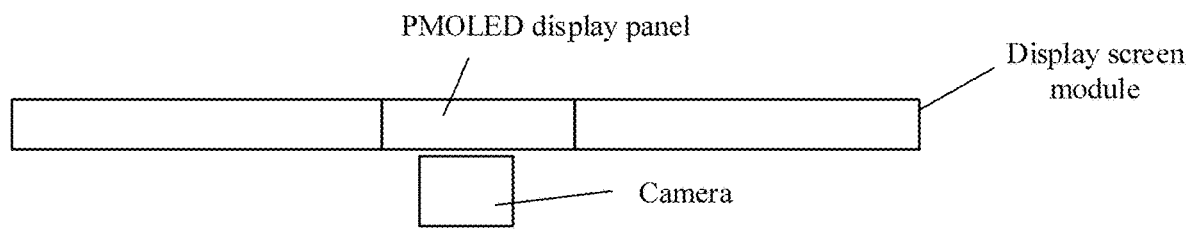
FIG. 2 is a schematic diagram of a terminal device according to an embodiment of this application.

FIG. 2 is a schematic diagram of a terminal device according to an embodiment of this application.

FIG. 2 is a sectional view of a terminal device according to an embodiment of this application (FIG. 2 may be considered as a sectional view of FIG. 1). As shown in FIG. 2, the terminal device includes a display screen module and a camera. The display screen module includes a PMOLED display panel, and the PMOLED display panel is located right above the camera.

As shown in FIG. 2, the PMOLED display panel includes two areas. A projection of one display area on the bottom surface can cover the camera properly. Assuming that the display area is the first display area, a transparent cable on the PMOLED display panel may be located in the first display area, and all electrode cables arranged in the first display area may be transparent cables, or the electrode cables arranged in the first display area may include transparent cables and non-transparent cables.

Figure 3:
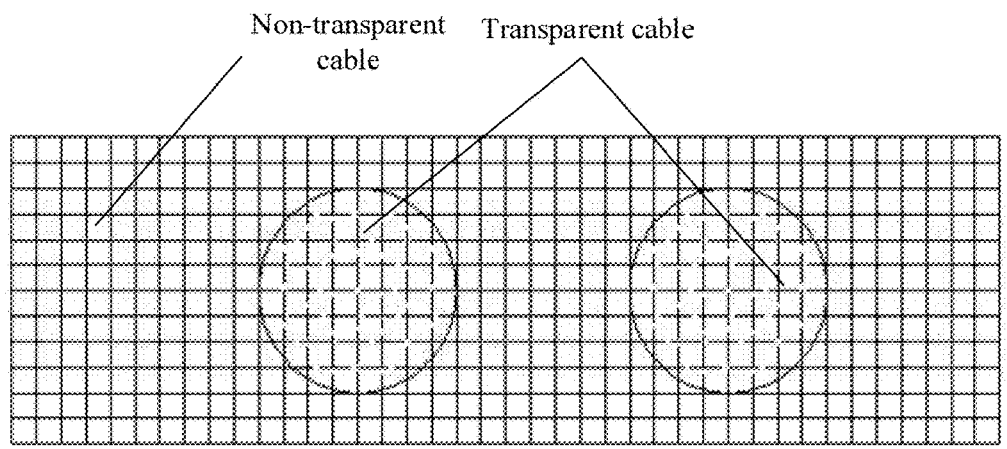
FIG. 3 is a schematic diagram of an electrode cable of a PMOLED display panel according to an embodiment of this application.

FIG. 3 is a schematic diagram of distribution of transparent cables and non-transparent cables in a PMOLED display panel. As shown in FIG. 3, the transparent cable is located in a circular region, and the non-transparent cable is located outside the circular region. The camera of the terminal device may be located right below the circular area in which the transparent cable is located. In FIG. 3, there are two circular areas that may correspond to two cameras.

It should be understood that FIG. 3 is merely an example of distribution of transparent cables and non-transparent cables included in the PMOLED display panel. Actually, a shape of a region in which the transparent cable is located may be a rectangle, a triangle, or any other shape. These region shapes fall within the protection scope of the embodiment of this application.

Optionally, as an embodiment, the terminal device in the embodiment of this application further includes a light sensor, and an orthographic projection of the light sensor on a display surface of the PMOLED display panel is located in a display area in which the transparent cable is located.

It should be understood that the foregoing light sensor may be a light sensor configured to sense ambient light intensity in the terminal device.

Figure 4:
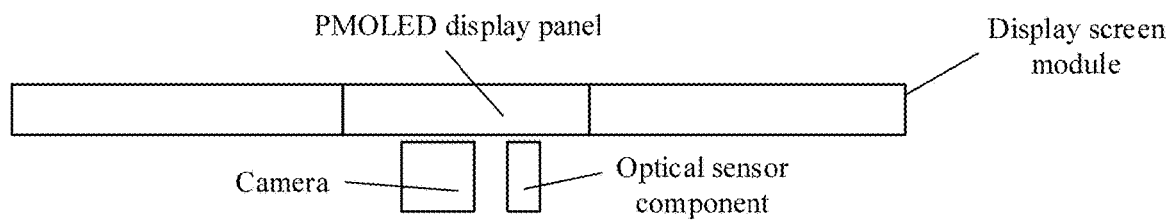
FIG. 4 is a schematic structural diagram of a terminal device according to an embodiment of this application.

Specifically, as shown in FIG. 4, the terminal device includes a PMOLED display panel, a camera, and a light sensor. Both the light sensor and the camera are located right below the PMOLED display panel.

Further, the PMOLED display panel in FIG. 4 may further include a first display area and a second display area. The first display area is a display area in which transparent cable is located on the PMOLED display panel, and the second display area is a display area in which non-transparent cable is located on the PMOLED display panel. The foregoing light sensor and the camera may be located right below the first display area.

Optionally, as an embodiment, the terminal device further includes a light shielding film (a light shielding layer), the light shielding film is disposed on the rear side of the PMOLED display panel, and an orthographic projection of the light shielding film on the display surface of the PMOLED display panel is outside the area in which the transparent cable is located.

The foregoing light shielding film or the light shielding layer may be made from any light-tight material or a material with relatively poor light transmission performance (better light shielding performance).

It is assumed that the PMOLED display panel includes a first display area and a second display area, the first display area is a display area in which a transparent cable on the PMOLED display panel is located, and the second display area is another display area on the PMOLED display panel other than the first display area. In this case, the foregoing light shielding film may be located on the rear side of the second display area of the PMOLED display panel. Specifically, the light shielding film may be located between the second display area and the rear housing of the PMOLED display panel.

Because light transmission performance of the PMOLED display panel is relatively good, a user can see an internal component of the terminal device through the PMOLED display panel. In this way, an appearance of the terminal device may be affected to some extent. Therefore, the light shielding film in this application can block the internal component of the terminal device, an aesthetic effect can be achieved.

Figure 5:
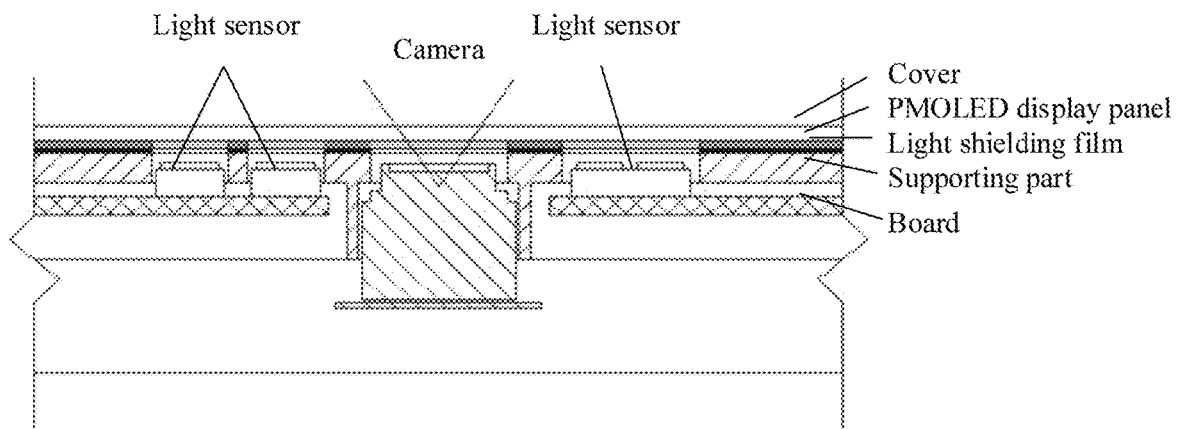
FIG. 5 is a schematic structural diagram of a terminal device according to an embodiment of this application.

The following describes a specific structure of the terminal device in this embodiment of this application in detail with reference to FIG. 5.

FIG. 5 is a sectional view of a PMOLED display panel of a terminal device. The terminal device shown in FIG. 5 includes a camera, a light sensor, and a PMOLED display panel. The light sensor and the camera are located below the PMOLED display panel, a light shielding film is disposed on a rear side of the PMOLED display panel, and the light shielding film is configured to block another component in the terminal device. A supporting component is disposed below the light shielding film, a board is disposed below the camera, the light sensor, and the supporting component, and a cover is disposed above the PMOLED display panel.

Optionally, in an embodiment, via holes are disposed on the PMOLED display panel, and electrode cables of the PMOLED display panel are converged to the control circuit board of the display screen module through the via holes.

Optionally, the via hole may be a metal via hole.

Optionally, the via hole on the PMOLED display panel may also be disposed at an edge portion or an edge area of the PMOLED display panel.

It should be understood that, the edge area or an area in which the edge portion of the PMOLED display panel is located may be an area in the PMOLED display panel, where a distance between the area and a center of the PMOLED display panel or a fixed position exceeds a preset distance.

The control circuit board may be located on a soft cable connected between the display screen and the board of the terminal device. The control circuit board can control the PMOLED display panel, to implement screen on or screen off of the PMOLED display panel.

Specifically, the terminal device may send different control signals to the control circuit board through a controller or a processor, to control the PMOLED display panel to enter the screen-on state or the screen-off state.

In this application, the via holes on the PMOLED display panel can be used to converge the electrode cables in the PMOLED display panel to the control circuit board, to avoid long edge bending caused when the electrode cables in the PMOLED display panel are directly converged to the control circuit board such that a black edge phenomenon generated at the edge of the PMOLED display panel due to long edge bending may be reduced or eliminated.

Figure 6:
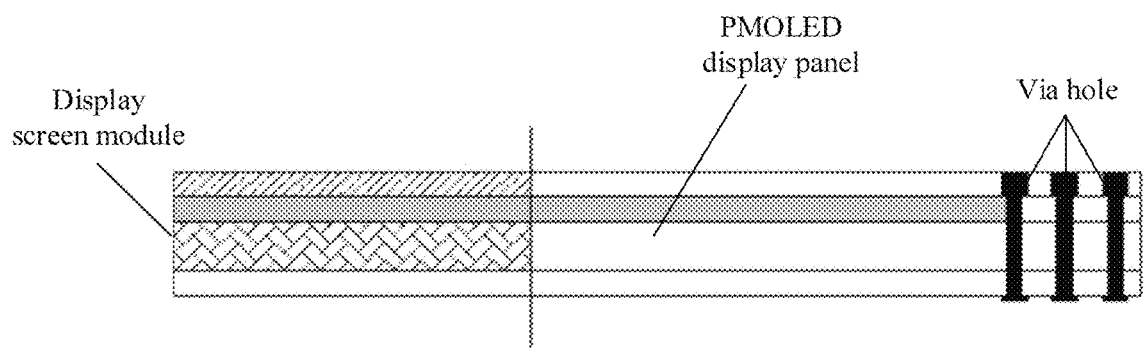
FIG. 6 is a schematic structural diagram of a terminal device according to an embodiment of this application.

As shown in FIG. 6, the via holes of the PMOLED display panel are located at an edge of the PMOLED display panel, the electrode cables in the PMOLED display panel can pass through the via holes and reach a bottom layer of the PMOLED display panel, and the electrode cables in the PMOLED and electrode cables of an AMOLED display panel are converged together to a flexible circuit board (equivalent to the foregoing control circuit board) in the terminal device.

Figure 7:
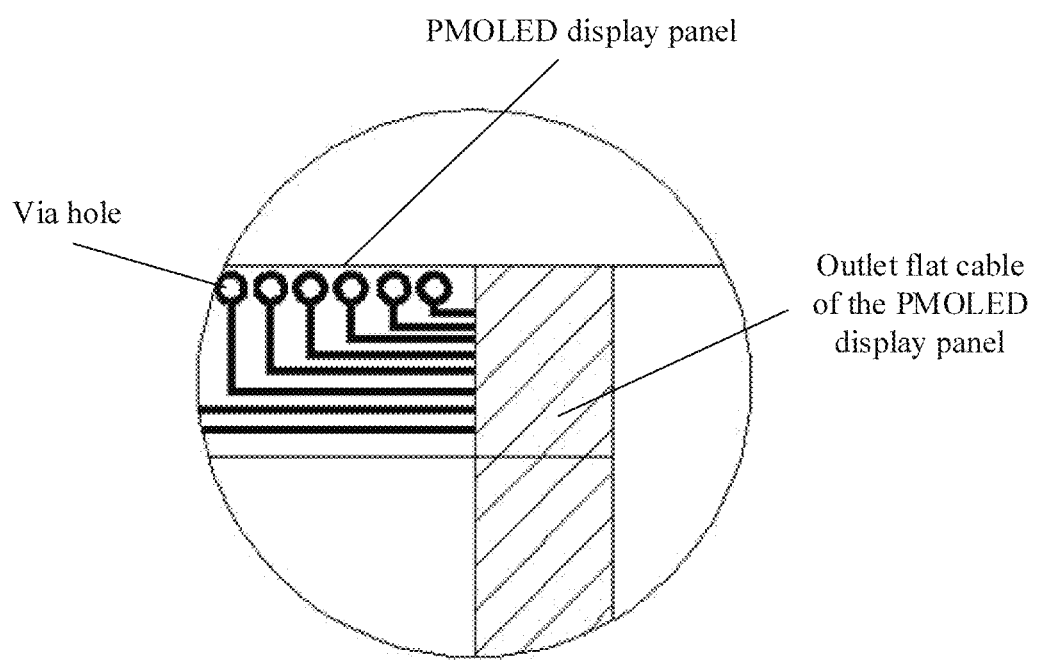
FIG. 7 is a schematic diagram of a via hole of a PMOLED display panel according to an embodiment of this application.

As shown in FIG. 7, via holes are disposed on an edge of the PMOLED display panel, and electrode cables of the PMOLED display panel are converged, through the via holes, to an outlet flat cable of the PMOLED display panel on a right side. It can be learned from FIG. 7 that, the cables can be directly converged to the flat cable through the via holes such that bending caused by cabling can be reduced.

Figure 8:
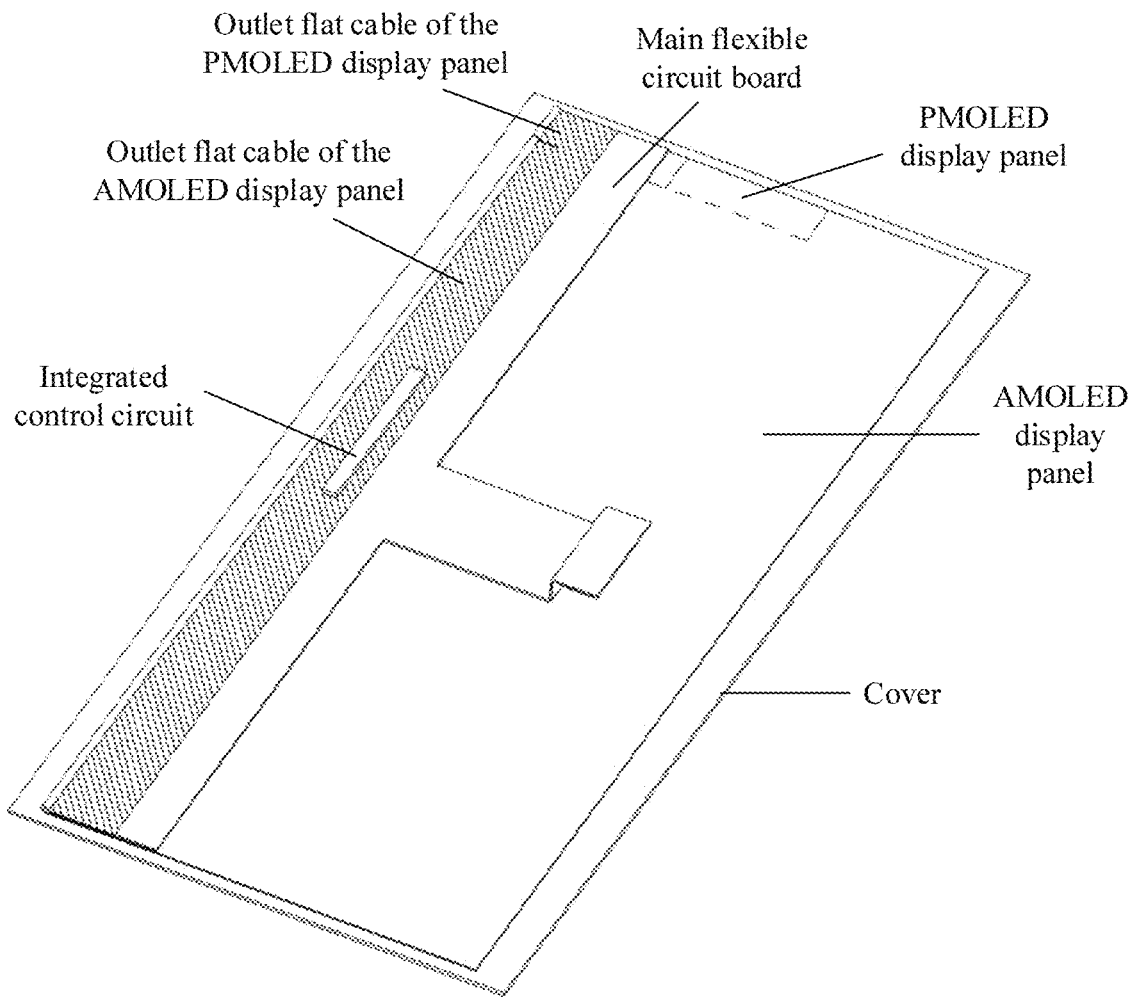
FIG. 8 is a schematic structural diagram of a terminal device according to an embodiment of this application.

FIG. 8 is a front view of a rear surface of the display screen module of the terminal device. The electrode cables of the PMOLED display panel pass through the via holes shown in FIG. 6 or FIG. 7 to the bottom, and then are converged to the outlet flat cable of the PMOLED display panel on a left side of the PMOLED display panel. The electrode cables of the AMOLED display panel may be converged, in an existing manner, to an outlet flat cable of the AMOLED display panel. The outlet flat cable of the AMOLED display panel and the outlet flat cable of the PMOLED display panel are connected to an integrated control circuit of a main flexible circuit board such that the cables of the PMOLED display panel and the cables of the AMOLED display panel are connected to the integrated control circuit. Therefore, the integrated circuit may be used to control screen on, screen off, image content to be displayed, and the like of the PMOLED display panel and the AMOLED display panel.

Optionally, the terminal device in the embodiment of this application is obtained by splicing a PMOLED display panel and an AMOLED display panel.

Because it is relatively difficult to implement a large-size display screen module using the PMOLED display panel, the large-size display screen module may be formed by splicing an AMOLED display panel and a PMOLED display panel.

There are specifically two splicing modes for splicing the AMOLED display panel and the PMOLED display panel parallel splicing and up-and-down overlapping splicing. The following describes the two splice modes in detail.

(1) Parallel Splicing

In a parallel splicing mode, the display screen module is formed by splicing a PMOLED display panel and an AMO-LED display panel in parallel. The PMOLED display panel and the AMOLED display panel share a same substrate and an organic light emitting layer.

It should be understood that, in a parallel splicing mode, the PMOLED display panel and the AMOLED display panel do not overlap each other, and a finally obtained display surface of the PMOLED display panel is flush with a display surface of the AMOLED display panel.

In this application, the PMOLED display panel and the AMOLED display panel share a same organic layer and substrate such that the PMOLED display panel and the AMOLED display panel can be well spliced (seamlessly spliced), and a visual effect can be improved. Therefore, when an image is displayed, an obvious boundary is avoided at the junction between the PMOLED display panel and the AMOLED display panel.

Figure 9:
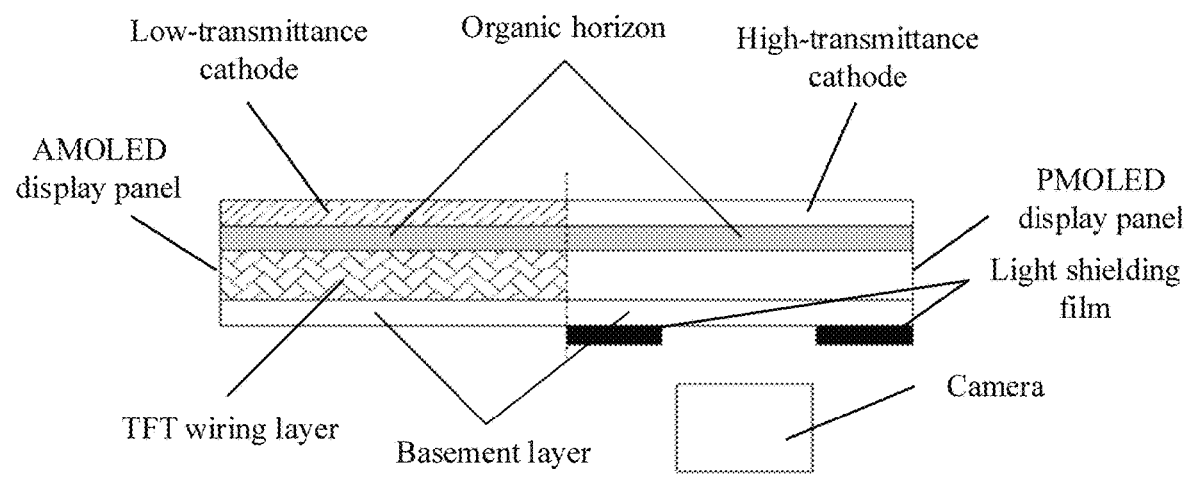
FIG. 9 is a schematic structural diagram of a terminal device according to an embodiment of this application.

As shown in FIG. 9, the terminal device includes a PMOLED display panel, an AMOLED display panel, a camera, and a light shielding film. The AMOLED display panel is located on the left side of the dashed line in the figure, the PMOLED display panel is located on the right side of the dashed line in the figure, the light shielding film and the camera are located below the PMOLED, and the display surface of the PMOLED display panel and the display surface of the AMOLED display panel are located on a same plane.

The PMOLED display panel uses a material with a high transmittance as a cathode, and the PMOLED display panel does not have a thin-film transistor (TFT) cable layer. The AMOLED display panel uses a material with a low transmittance as a cathode, and the AMOLED display panel further has a TFT cable layer. Therefore, compared with the AMOLED display panel, the PMOLED display panel has better light transmission performance.

In addition, as shown in FIG. 9, the PMOLED display panel and the AMOLED display panel share a same organic light emitting layer and substrate such that the PMOLED display panel and the AMOLED display panel can be seamlessly spliced, and an overall display effect when the display screen module displays an image can be improved.

(2) Up-and-Down Overlapping Splicing

In the up-and-down overlapping splicing mode, the PMOLED display panel is located on an external side of the AMOLED display panel, the AMOLED display panel is provided with a window, and the PMOLED display panel is overlaid on an edge of the window of the AMOLED display panel, and blocks the window of the AMOLED display panel.

As the window of the AMOLED display panel has a bezel, the bezel cannot properly display an image. Therefore, in a process of splicing the PMOLED display panel and the AMOLED display panel, if the window of the AMOLED display panel is not blocked using the PMOLED display panel, when the terminal device displays an image, an image boundary or a black edge is generated at a junction of the two display panels.

Therefore, when the AMOLED display panel is spliced with the PMOLED display panel, the window of the AMO-LED display panel needs to be blocked using a display area of the PMOLED display panel, to better implement splicing between the PMOLED display panel and the AMOLED display panel. This prevents the terminal device from generating an image boundary or a black edge at a junction of the two display panels when displaying an image.

In addition, after the PMOLED display panel and the AMOLED display panel are spliced in an up-and-down overlapping manner, the display surface of the PMOLED display panel is not aligned with the display surface of the AMOLED display panel (in different planes). In this case, the display surface of the AMOLED display panel may be covered with some transparent materials such that the transparent material covered above the display surface of the AMOLED display panel and the display surface of the PMOLED display panel are in a same plane, to ensure a display effect.

Figure 10:
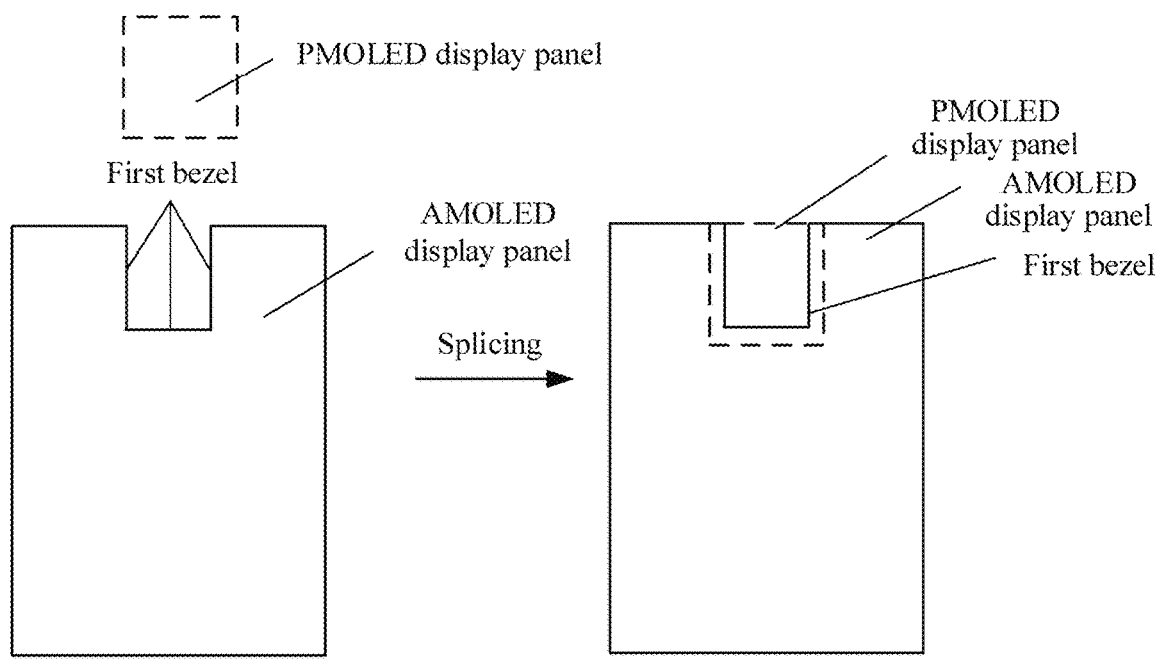
FIG. 10 is a schematic diagram of splicing a PMOLED display panel and an AMOLED display panel according to an embodiment of this application.

FIG. 10 is a schematic diagram of a display screen module obtained by splicing a PMOLED display panel and an AMOLED display panel. As shown on the left side of FIG. 10, a shape of the PMOLED display panel is a rectangle, a shape of the AMOLED display panel is a rectangle with a gap, the gap of the AMOLED display panel is a window of the AMOLED display panel, and a bezel at the window may be referred to as a first bezel. The display screen module obtained after the PMOLED display panel and the AMOLED display panel are spliced is shown on a right side in FIG. 10. The first bezel at the window of the AMOLED display panel is completely covered by a display area of the PMOLED display panel.

Figure 11:
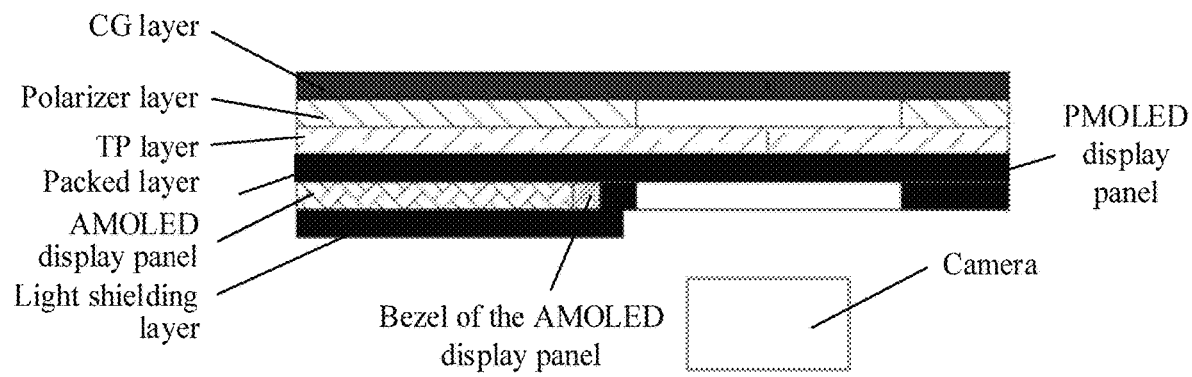
FIG. 11 is a schematic structural diagram of a terminal device according to an embodiment of this application.

As shown in FIG. 11, the display screen module is obtained by splicing a PMOLED display panel and an AMOLED display panel through up-and-down overlapping splicing. The PMOLED display panel is stacked above the AMOLED display panel, and a bezel (a bezel at a boundary between the PMOLED display panel and the AMOLED display panel) of the AMOLED display panel is located below the PMOLED display panel. In this way, when the PMOLED display panel displays an image, the bezel of the AMOLED display panel can be blocked in order to achieve a better display effect.

In addition, as shown in FIG. 11, to ensure smoothness of the display area of the display screen module, a filling layer may be disposed on the AMOLED display panel (a material of the filling layer may be a material with relatively desirable light transmittance, for example, transparent glass), to ensure that an upper surface of the filling layer and a display surface of the PMOLED display panel are in a same plane. A cover glass (CG) layer, a polarizer layer, and a touch panel (TP) layer are further disposed above the PMOLED display panel, and a light shielding layer or a light shielding film is disposed below the PMOLED display panel.

Optionally, in an embodiment, a difference between pixel density of the PMOLED display panel and pixel density of the AMOLED display panel is less than a preset threshold.

Further, pixel density of the PMOLED display panel is the same as pixel density of the AMOLED display panel.

The foregoing pixel density may be measured using a quantity of pixels per inch (PPI).

When the pixel density of the PMOLED display panel and the pixel density of the AMOLED display panel differ slightly or are the same, a displayed image can have a relatively good display effect, and uniformity of the displayed image can be ensured.

Figure 12:
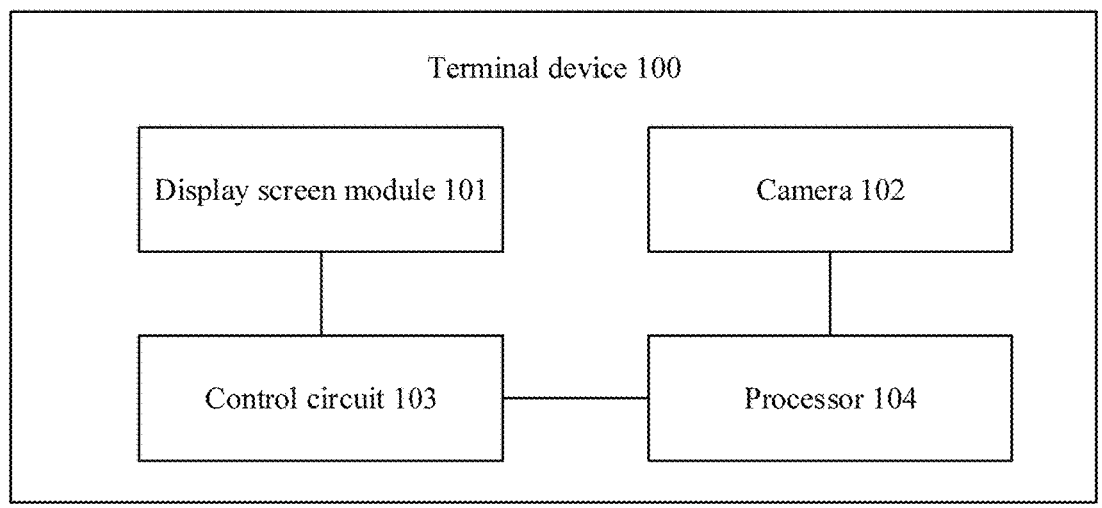
FIG. 12 is a schematic block diagram of a terminal device according to an embodiment of this application.

FIG. 12 is a schematic block diagram of a terminal device according to an embodiment of this application.

The terminal device 100 shown in FIG. 12 includes a display screen module 101, a camera 102, a control circuit 103, and a processor 104 (which may also be referred to as a controller). The control circuit 103 is connected to a PMOLED display panel, and is configured to control screen on and screen off of the PMOLED display panel. Specific structures of the display screen module 101 and the camera 102 may be corresponding structures shown in FIG. 1 to FIG. 11.

When the camera 102 is in a working state, the processor 104 is configured to send a first control signal to the control circuit 103, to control the PMOLED display panel to enter a screen-off state.

When the camera 102 is in a non-working state, the processor 104 is configured to send a second control signal to the control circuit 103, to control the PMOLED display panel to enter a screen-on state.

It should be understood that a specific structure of the terminal device 100 shown in FIG. 12 may be a structure of the terminal device in FIG. 1 to FIG. 11. Related descriptions of the display screen module and the camera of the terminal device in the foregoing FIG. 1 to FIG. 11 are also applicable to the terminal device shown in FIG. 12.

Optionally, in an embodiment, the terminal device 100 may further include a light sensor 105, and an orthographic projection of the light sensor 105 on a display surface of the PMOLED display panel is located in a display area in which the transparent cable is located.

The light sensor 105 and the camera 102 are different components. The light sensor 105 may be a sensor configured to sense ambient light intensity in the terminal device.

When the terminal device includes the light sensor 105, the processor 104 may further control, based on whether the light sensor 105 is in a working state, the PMOLED display panel to enter a screen-on state or a screen-off state, to ensure normal operation of the light sensor 105.

Specifically, when the light sensor 105 is in a working state, the processor 104 is configured to send a third control signal to the control circuit 103, to control the PMOLED display panel to enter a screen-off state, when the light sensor 105 is in a non-working state, the processor 104 is configured to send a fourth control signal to the control circuit, to control the PMOLED display panel to enter a screen-on state.

It should be understood that, when the terminal device 100 includes both the camera 102 and the light sensor 105, control logic of the processor 104 is as follows, when at least one of the camera 102 and the light sensor 105 is in a working state, the processor 104 sends a control signal to the control circuit 103, to control the PMOLED display panel to enter a screen-off state, and only when both the camera 102 and the light sensor 105 are in the non-working state, the processor 104 sends a control signal to the control circuit 103, to control the PMOLED display panel to enter a screen-on state.

The foregoing describes a structure of the terminal device in the embodiments of this application with reference to FIG. 1 to FIG. 12. The following describes a display method in an embodiment of this application with reference to FIG. 13. It should be understood that, the display method in the embodiments of this application may be performed by the terminal device shown in FIG. 1 to FIG. 12 (the display method in the embodiments of this application is applicable to the foregoing terminal device shown in FIG. 1 to FIG. 12).

Figure 13:
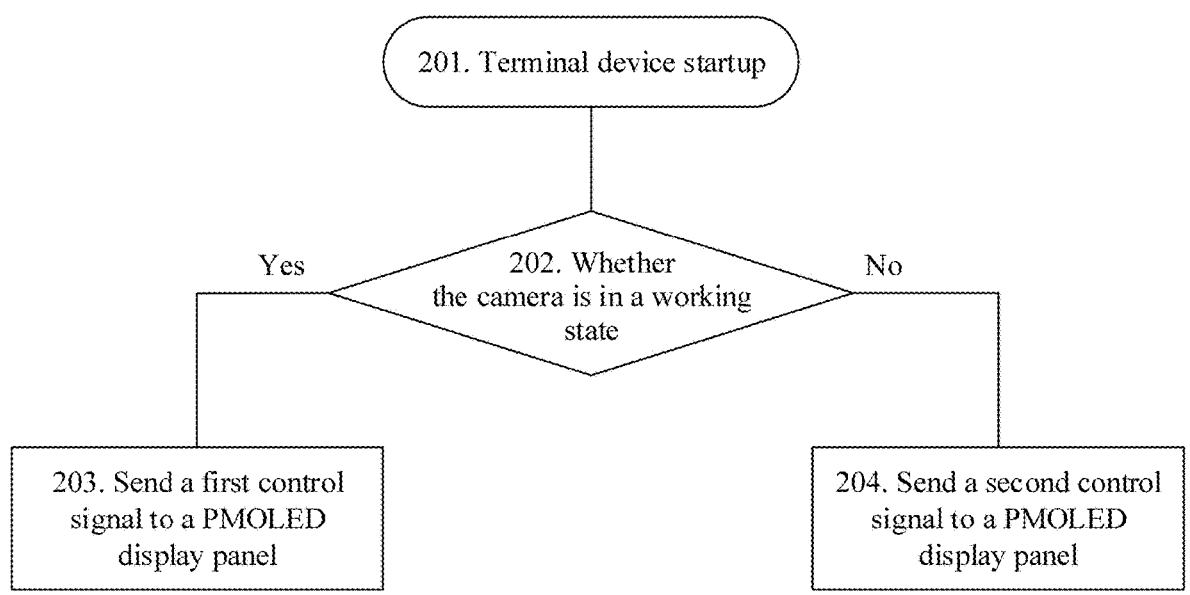
FIG. 13 is a schematic flowchart of a display method according to an embodiment of this application.

The display method shown in FIG. 13 further includes step 201 to step 204. The display method shown in FIG. 13 may be performed by a controller or a processor in a terminal device. The following separately describes steps 201 to 204 in detail.

201. The terminal device is powered on.

202. Determine whether the camera is in a working state.

After the terminal device is powered on, the processor or the controller determines whether the camera is in a working state. When the camera is in a working state, step 203 is performed. Alternatively, when the camera is in a non-working state, step 204 is performed.

It should be understood that, that the camera is in a working state may refer to that the camera is in an image collection state. Specifically, that the camera is in a working state may refer to that the camera is used to take a selfie, a video call, or a video chat, or the camera is used as a mirror or the like. When the camera does not collect an image, it may be considered that the camera is in the non-working state.

203. Send a first control signal to a PMOLED display panel.

204. Send a second control signal to the PMOLED display panel.

The first control signal is used to control the PMOLED display panel to enter a screen-off state, and the foregoing second control signal is used to control the PMOLED display panel to enter a screen-on state.

When the PMOLED display panel receives the first control signal, if the PMOLED display panel is in a screen-on state, the PMOLED display panel is switched from the screen-on state to the screen-off state.

When the PMOLED display panel receives the second control signal, if the PMOLED display panel is in the screen-off state, the PMOLED display panel is switched from the screen-off state to the screen-on state.

It should be understood that the processor or the controller may directly send a control signal to the PMOLED display panel, or may send a control signal to a control circuit connected to the PMOLED display panel such that the control circuit can control screen on and screen off of the PMOLED display panel based on the control signal.

It should be further understood that the display method in this embodiment of this application may alternatively include steps 202 to step 204 only. In other words, the display method in this embodiment of this application may start to be performed when the terminal device is in a power-on state.

In this application, because the camera is disposed below the region in which the transparent cable on the PMOLED display panel is located, the screen-on state and the screen-off state of the PMOLED display panel can be controlled, to meet a light collection requirement of the camera during working, and a bezel-less screen display effect can be achieved when the camera is in a non-working state.

Figure 14:
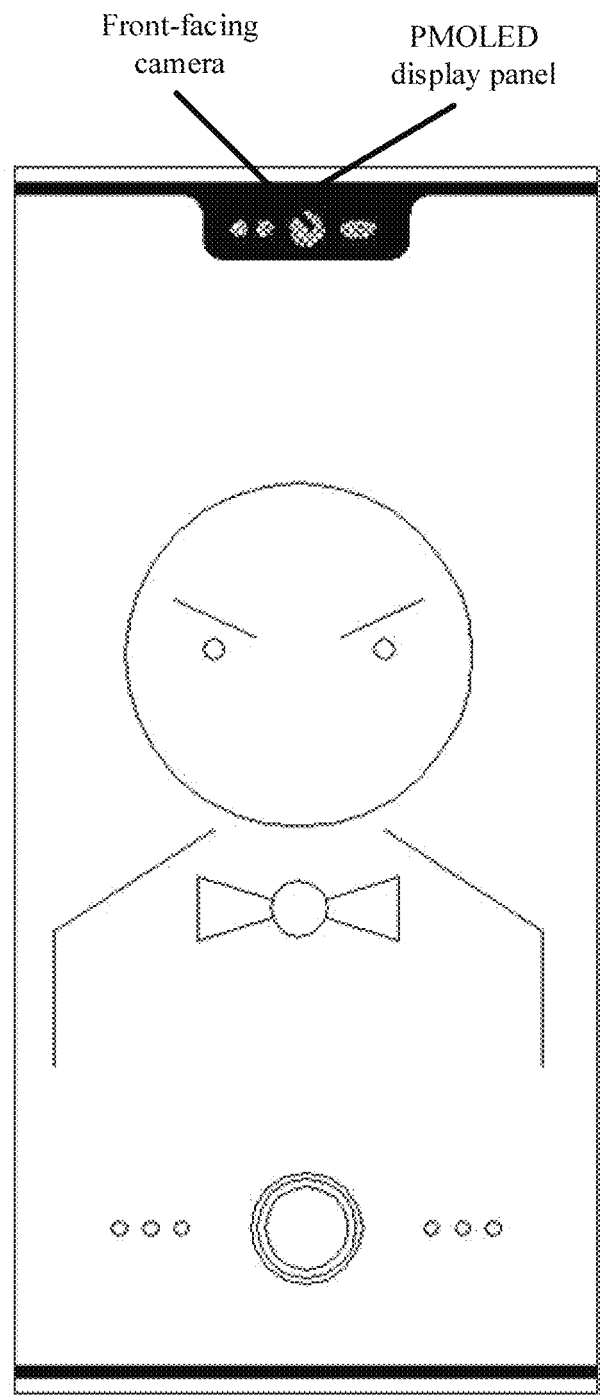
FIG. 14 is a schematic diagram when a terminal device is in a selfie scenario.

For example, as shown in FIG. 14, the front-facing camera is located in a circular area on the top of the terminal device, the PMOLED display panel is located above the front-facing camera, and the user takes a selfie using the front-facing camera. In this case, the front-facing camera is in a working state. In this case, the terminal device controls the working state of the PMOLED display panel such that the PMOLED display panel is in the screen-off state.

Figure 15:
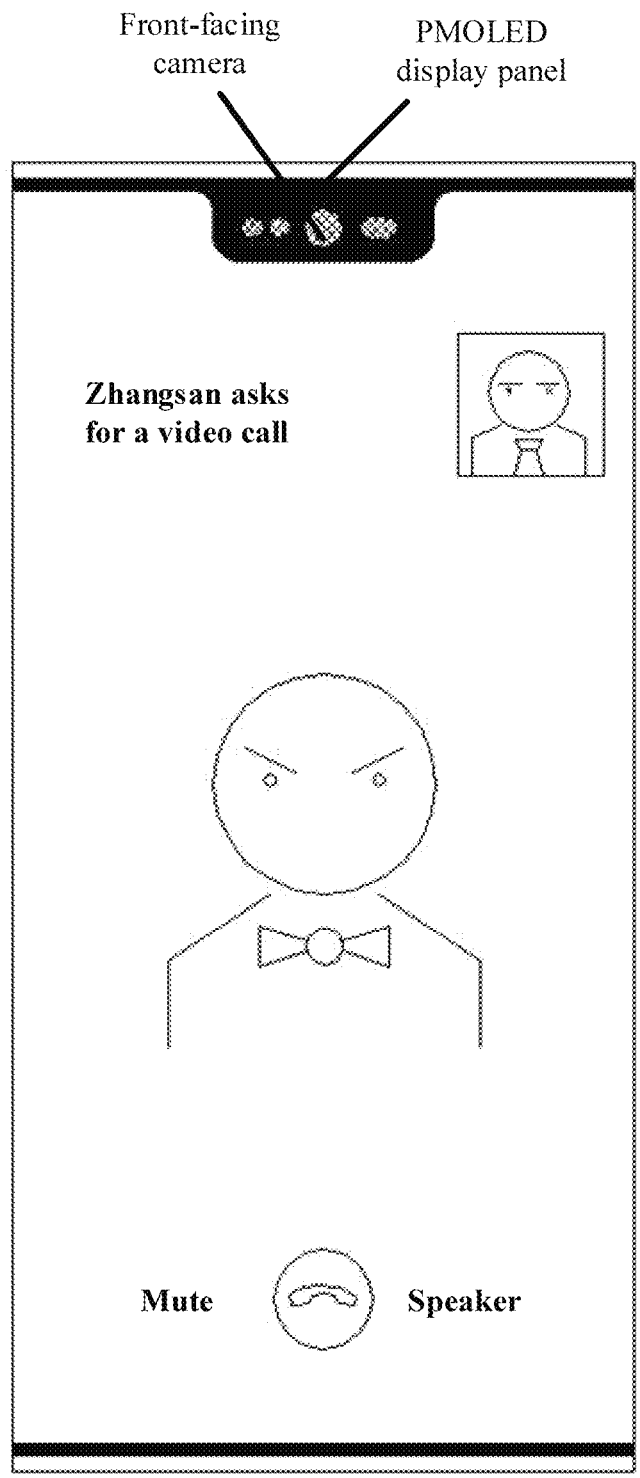
FIG. 15 is a schematic diagram when a terminal device is in a video calling scenario.

Similarly, as shown in FIG. 15, the front-facing camera is located in a circular area on the top of the terminal device, the PMOLED display panel is located above the front-facing camera, and the user receives a video call request from Zhang San and is about to perform a video call. In this case, the front-facing camera is also in a working state. In this case, the terminal device also controls the status of the PMOLED display panel such that the PMOLED display panel is in the screen-off state.

Optionally, in an embodiment, when the terminal device referred to in the display method of the embodiment of this application further includes a light sensor, and an orthographic projection of the light sensor on a display surface of the PMOLED display panel is located in a display area in which the transparent cable is located, the display method in the embodiment of this application further includes, when at least one of the camera and the light sensor is in a working state, the PMOLED display panel is controlled, to enable the PMOLED display panel to enter a screen-off state, and when both the camera and the light sensor are in a non-working state, the PMOLED display panel is controlled, to enable the PMOLED display panel to enter a screen-on state.

In this application, screen on and screen off of the PMOLED display panel are controlled based on the working states of the camera and the light sensor such that a lighting requirement of the camera and the light sensor during normal operation can be met.

Optionally, in this application, the processor or the controller may further adjust, by sending control signals to the PMOLED display panel and the AMOLED display panel, pixel density when the PMOLED display panel and the AMOLED display panel display images.

For example, if the pixel density of the PMOLED display panel is 300 PPI, and the pixel density of the AMOLED display panel is 500 PPI, the processor or the controller may send a control signal to the AMOLED display panel such that the pixel density of the AMOLED display panel when displaying an image is also 300 PPI in order to ensure that the pixel density of the PMOLED display panel and the pixel density of the AMOLED display panel when the PMOLED display panel and the AMOLED display panel display images are both 300 PPI such that the pixel density is consistent when the two display panels display images, thereby improving an image display effect.

An ordinary skilled technician in the art may be aware that, in combination with the examples described in the embodiments disclosed in this specification, units and algorithm steps may be implemented by electronic hardware or a combination of computer software and electronic hardware. Whether the functions are performed by hardware or software depends on particular applications and design constraint conditions of the technical solutions. A skilled technician in the art may use different methods to implement the described functions for each particular application, but it should not be considered that the implementation goes beyond the scope of this application.

It may be clearly understood by a skilled technician in the art that, for the purpose of convenient and brief description, for a detailed working process of the foregoing system, apparatus, and unit, refer to a corresponding process in the foregoing method embodiments, and details are not described herein again.

In the several embodiments provided in this application, it should be understood that the disclosed systems, apparatuses, and methods may be implemented in other manners. For example, the described apparatus embodiments are merely examples. For example, the unit division is merely logical function division and may be other division in an embodiment. For example, a plurality of units or components may be combined or integrated into another system, or some features may be ignored or not performed. In addition, the displayed or discussed mutual couplings or direct couplings or communication connections may be implemented using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected based on actual requirements to achieve the objectives of the solutions of the embodiments.

In addition, functional units in the embodiments of this application may be integrated into one processing unit, or each of the units may exist alone physically, or two or more units are integrated into one unit.

When the functions are implemented in the form of a software functional unit and sold or used as an independent product, the functions may be stored in a computer-readable storage medium. Based on such an understanding, the technical solutions of this application essentially, or the part contributing to other approaches, or some of the technical solutions may be implemented in a form of a software product. The software product is stored in a storage medium, and includes several instructions for instructing a computer device (which may be a personal computer, a server, a network device, or the like) to perform all or some of the steps of the methods described in the embodiments of this application. The foregoing storage medium includes any medium that can store program code, such as a Universal Serial Bus (USB) flash drive, a removable hard disk, a read-only memory (ROM), a random-access memory (RAM), a magnetic disk, or an optical disc.

What is claimed is:

1. A terminal device, comprising:
a display screen system comprising a passive matrix organic light-emitting diode (PMOLED) display panel and an active-matrix organic light-emitting diode (AMOLED) display panel, wherein the PMOLED display panel is located on an external side of the AMOLED display panel, wherein the AMOLED display panel comprises a window, wherein the PMOLED display panel is configured to be superimposed on an edge of the window and covers the window, and wherein the PMOLED display panel comprises:
a plurality of electrode cables comprising a transparent cable; and
a display surface comprising a display region, wherein the transparent cable is formed in the display region; and
a camera coupled to the display screen system and comprising a lighting region, wherein an orthographic projection of the lighting region on the display surface is located in the display region.

2. The terminal device of claim 1, wherein the display screen system further comprises a control circuit board coupled to the PMOLED display panel, wherein the PMOLED display panel further comprises via holes, and wherein the electrode cables are converged to the control circuit board through the via holes.

3. The terminal device of claim 2, wherein the via holes are disposed at an edge portion of the PMOLED display panel.

4. The terminal device of claim 1, further comprising a light shielding film coupled to the display screen system and disposed on a rear side of the PMOLED display panel, wherein an orthographic projection of the light shielding film on the display surface is located outside the display region.

5. The terminal device of claim 1, wherein a material of the transparent cable comprises indium tin oxide (ITO).

6. The terminal device of claim 1, further comprising a light sensor coupled to the display screen system, wherein an orthographic projection of the light sensor on the display surface is located in the display region.

7. The terminal device of claim 1, wherein a material of the transparent cable comprises indium zinc oxide (IZO).

8. The terminal device of claim 1, wherein a material of the transparent cable comprises indium gallium zinc oxide (IGZO).

9. The terminal device of claim 1, wherein a material of the transparent cable comprises indium gallium Sn oxide (InGaSnO).

10. The terminal device of claim 1, wherein a material of the transparent cable comprises graphene.

11. The terminal device of claim 1, wherein a difference between a pixel density of the PMOLED display panel and a pixel density of the AMOLED display panel is less than a preset threshold.

12. The terminal device of claim 1, wherein a pixel density of the PMOLED display panel is the same as a pixel density of the AMOLED display panel.

13. The terminal device of claim 2, wherein a pixel density of the PMOLED display panel is the same as a pixel density of the AMOLED display panel.

14. A terminal device, comprising:
a display screen system comprising a passive-matrix organic light-emitting diode (PMOLED) display panel and an active-matrix organic light-emitting diode (AMOLED) display panel, wherein the PMOLED display panel is located on an external side of the AMOLED display panel, wherein the AMOLED display panel comprises a window, wherein the PMOLED display panel is configured to be superimposed on an edge of the window and covers the window, and wherein the PMOLED display panel comprises:
a plurality of electrode cables comprising a transparent cable; and
a display surface comprising a display region, wherein the transparent cable is formed in the display region;
a camera coupled to the display screen system and comprising a lighting region, wherein an orthographic projection of the lighting region on the display surface is located in the display region;
a control circuit coupled to the display screen system and configured to control a screen-on function and a screen-off function of the PMOLED display panel; and
a processor coupled to the display screen system and configured to:
send a first control signal to the control circuit to control the PMOLED display panel to enter a screen-off state when the camera is in a working state; and
send a second control signal to the control circuit to control the PMOLED display panel to enter a screen-on state when the camera is in a non-working state.

15. A display method implemented by a terminal device comprising a display screen system and a camera, wherein the display screen system comprises a passive matrix organic light-emitting diode (PMOLED) display panel and an active-matrix organic light-emitting diode (AMOLED) display panel, wherein the PMOLED display panel is located on an external side of the AMOLED display panel, wherein the AMOLED display panel comprises a window, wherein the PMOLED display panel is configured to be superimposed on an edge of the window and covers the window, wherein the PMOLED display panel comprises a plurality of electrode cables comprising a transparent cable and a display surface comprising a display region, wherein the camera comprises a lighting region, wherein an orthographic projection of the lighting region on the display surface is located in the display region, wherein the transparent cable is formed in the display region, and wherein the display method comprises:
controlling the PMOLED display panel such that the PMOLED display panel enters a screen-off state when the camera is in a working state; and
controlling the PMOLED display panel such that the PMOLED display panel enters a screen-on state when the camera is in a non-working state.

16. The terminal device of claim 14, wherein a material of the transparent cable is indium zinc oxide (IZO).

17. The terminal device of claim 14, wherein a material of the transparent cable is indium gallium zinc oxide (IGZO).

18. The terminal device of claim 14, wherein a material of the transparent cable is indium gallium Sn oxide (InGaSnO).

19. The terminal device of claim 14, wherein a material of the transparent cable is graphene.

* * * * *